United States Patent [19]

Kamiya et al.

[11] 4,287,440

[45] Sep. 1, 1981

[54] PROXIMITY SWITCHING DEVICE

[75] Inventors: Fumio Kamiya, Kyoto; Hisatoshi Nodera, Kusatsu; Kenji Ueda, Muko; Hiroyuki Miyamoto, Kameoka, all of Japan

[73] Assignee: Omron Tateisi Electronics Co., Kyoto, Japan

[21] Appl. No.: 66,405

[22] Filed: Aug. 14, 1979

[30] Foreign Application Priority Data

Aug. 31, 1978 [JP] Japan ................. 53-107141

[51] Int. Cl.³ .............................................. H03K 3/26
[52] U.S. Cl. ............................... 307/315; 307/255; 307/308
[58] Field of Search ............... 307/308, 315, 116, 255; 328/5; 331/61; 340/669; 200/DIG. 1

[56] References Cited

U.S. PATENT DOCUMENTS

| | | | |
|---|---|---|---|
| 3,003,108 | 10/1961 | Thiele | 307/315 |
| 3,260,912 | 7/1966 | Gregory | 307/315 UX |
| 3,919,661 | 11/1975 | Buck | 328/5 |
| 4,128,742 | 12/1978 | Davis | 307/315 |

*Primary Examiner*—Stanley D. Miller, Jr.
*Assistant Examiner*—B. P. Davis
*Attorney, Agent, or Firm*—Wegner & Bretschneider

[57] ABSTRACT

A proximity switching device is disclosed, which comprises an oscillating circuit including a detection coil, a signal producing circuit for producing a detection signal in response to an oscillating amplitude of said oscillating circuit, and an output circuit for producing an output signal in response to said detection signal. The output circuit comprises a pair of Darlington circuits and a driving transistor for driving said Darlington circuits, one of said Darlington circuits operating as a NPN transistor and another operating as a PNP transistor, said Darlington circuit being connected complementarily for providing complementary output signals.

4 Claims, 4 Drawing Figures

PROXIMITY SWITCHING DEVICE

BACKGROUND OF THE INVENTION

This invention relates to a proximity switching device of the type including a high frequency oscillating circuit and, more particularly, to an output circuit thereof.

A well known proximity switching device comprises an oscillating circuit including a detection coil, a signal producing circuit for producing a detection signal in response to the amplitude of the oscillating circuit, and an output circuit for producing an output signal in response to the detection signal. The output circuit is composed of a NPN transistor or PNP transistor. A load such as an electromagnetic relay is connected between an output terminal and a source terminal when a NPN transistor is used, while the load is connected between the output terminal and a ground terminal when a PNP transistor is used.

It is also known that a complementary transistor pair, consisting of a PNP transistor and a NPN transistor, is used in the output circuit. For example, an emitter of NPN transistor is connected to a ground terminal, while an emitter of PNP transistor is connected to a source line, and the collectors of NPN and PNP transistors are both connected to a common output terminal. The load, of which there are two types and a terminal of which should be connected to a source line or ground depending on the particular type, may be optionally connected between the common output terminal and source terminal or between the common output terminal and ground terminal. Such output circuit including a complementary transistor pair, however, has the disadvantage that a pair of output transistors would undesirably operate simultaneously or entail large power consumption when a resistor or resistors are used in order to preclude the simultaneous operation.

Therefore, it is an object of this invention to provide a proximity switching device comprising an output circuit including a complementary transistor pair which is not simultaneously operative but alternately operative.

It is another object of this invention to provide a proximity switching device which needs less power.

It is another object of this invention to provide a proximity switching device including an output circuit whose saturation voltage is low.

It is a further object of this invention to provide a proximity switching device having at least an output circuit integrated in a semiconductor chip.

DETAILED DESCRIPTION OF THE PREFERRED EMBODIMENTS

Figure 1:
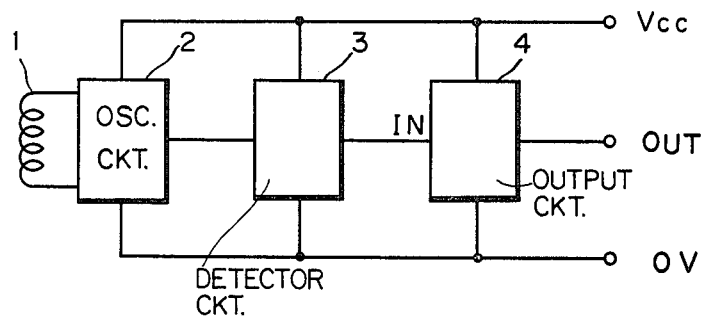
FIG. 1 is a block diagram of a proximity switching device according to the present invention.

In FIG. 1, a proximity switching device in accordance with the present invention comprises a known oscillating circuit 2 including a coil 1, a known detection signal producing circuit 3, and an output circuit 4.

The detection coil 1 is a part of a LC resonance circuit. When an object approaches the coil 1, an oscillation amplitude of the oscillating circuit 2 changes. Since the signal producing circuit 3 discriminates the oscillation amplitude level, it produces a detection signal on receiving such an amplitude change. The output circuit 4 receives the detection signal and produces an amplified output signal.

A load such as an electromagnetic relay or any control circuit may be connected between a common output terminal "OUT" and a ground terminal "OV" or between the terminal "OUT" and a source terminal "Vcc".

Figure 2:
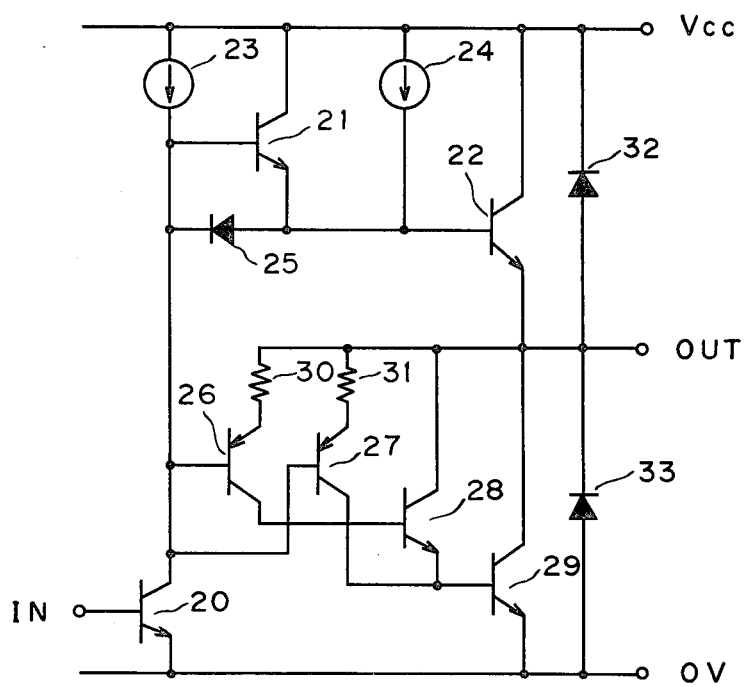
FIG. 2 is a preferred embodiment of the output circuit in FIG. 1.

A preferred embodiment of the output circuit 4 of FIG. 1 is shown in FIG. 2, which comprises a pair of Darlington circuits. One of the Darlington circuits consists of two NPN transistors (hereinafter, NPN Darlington circuit), with another Darlington circuit consisting of two PNP transistors and two NPN transistors (hereinafter, PNP Darlington circuit).

NPN Darlington circuit operates as a NPN transistor, while PNP Darlington circuit operates as a PNP transistor even though it comprises NPN transistors.

The two Darlington circuits are interconnected so as to function as a complementary transistor pair.

Input base terminals of the two Darlington circuits are connected to a collector of a transistor 20 which drives the Darlington circuits in response to a detection signal from the detection signal producing circuit 3 shown in FIG. 1.

Two constant-current circuits 23 and 24 are connected in the NPN Darlington circuit so as to supply a constant-base-biasing-current to transistors 21 and 22, respectively.

Resistors 30 and 31, connected to the emitters of transistors 26 and 27, respectively, may be alternatively connected to the base thereof, respectively.

Two diodes 32 and 33 are for absorbing the surge voltage which is generated when a capacitive load or inductive load is connected.

In operation, transistor 20 is initially biased off, but turns on when an input signal from the detection signal producing circuit 3 is fed to the base of transistor 20, which causes the NPN Darlington circuit consisting of transistors 21 and 22, initially biased on, to be turned and the PNP Darlington circuit consisting of transistors 26 through 29 and resistors 30 and 31, initially biased off, to be turned on.

When the driving transistor 20 is biased off, the NPN Darlington circuit feeds a load current to the load connected across the terminals "OUT" and "OV". When the driving transistor 20 is turned on, the PNP Darlington circuit draws the load current from source line through the load connected across the terminals "OUT" and "Vcc".

According to the present invention, the above-mentioned two Darlington circuits never operate simultaneously. The reason is as follows: When a load is connected across the upper or lower Darlington circuit, a certain voltage Vo appears at the common output terminal "OUT". The transistor 22 turns on when the base voltage is higher than $Vo + V_{BE}$ ($V_{BE}$ means voltage across Base and Emitter), while the transistor 29 turns on when the base voltage is lower than $Vo - V_{BE}$. Since the voltage at collector of driving transistor 20 cannot satisfy both conditions simultaneously, transistors 22 and 29 or NPN Darlington circuit and PNP Darlington circuit cannot operate simultaneously.

When the load current is rather small, only transistor 22 or transistors 27 and 29, which is/are the last stage of each Darlington circuit, operate and transistor 21 or transistors 26 and 28, which is/are the first stage, is/are out of operation. As a result, the saturation voltage of each Darlington circuit depends solely on transistor 22 or 29.

When the load current is rather large, all of transistors 21, 22 or 26 through 29 operate as a Darlington circuit, resulting in an increase of saturation voltage. The total base current or loss current of each Darlington circuit, however, substantially does not increase with increasing load current. The above-mentioned operation is accomplished by adjusting the constant-current circuits 23, 24 and resistors 30, 31.

Figure 3:
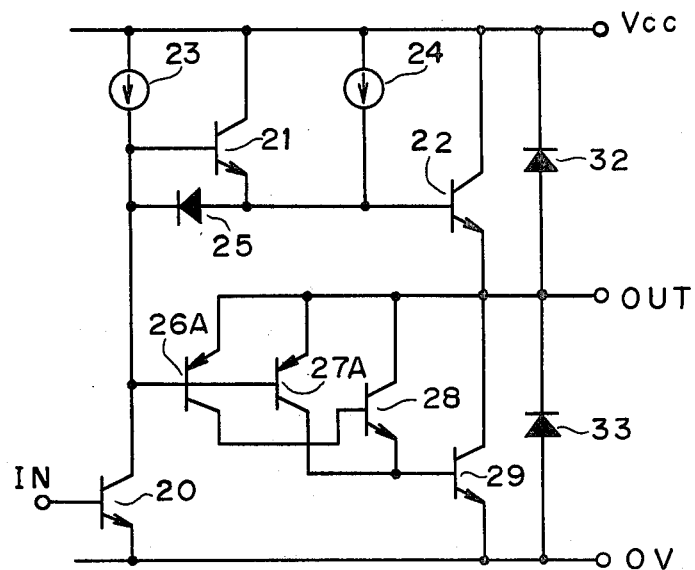
FIG. 3 and FIG. 4 are modified embodiments of the output circuit shown in FIG. 2.

FIG. 3 shows a modification of the output circuit of FIG. 2. In FIG. 3, transistors 26A and 27A are corresponding to transistors 26 and 27 in FIG. 2, which are constructed as a multi-collector transistor with common emitter and base. Such transistor is easy to be integrated in a one-chip semiconductor when the output circuit or whole circuit of the proximity switching device is to be integrated. Suitable resistors may be connected to emitters or bases as described above.

In FIG. 2 and FIG. 3, a diode 25 is adapted to pass a current from constant-current circuit 24 to the collector of driving transistor 20 without shorting the base-emitter of transistor 21. When a load is connected between terminals "OUT" and "OV" and the driving transistor 20 is turned on, the base-emitter voltage of transistor 22 and the forward drop voltage of diode 25 are counterbalanced, a voltage approximating the collecter-emitter saturation voltage of the driving transistor 20, which is approximately 0.2 V, remaining between said terminals.

Figure 4:
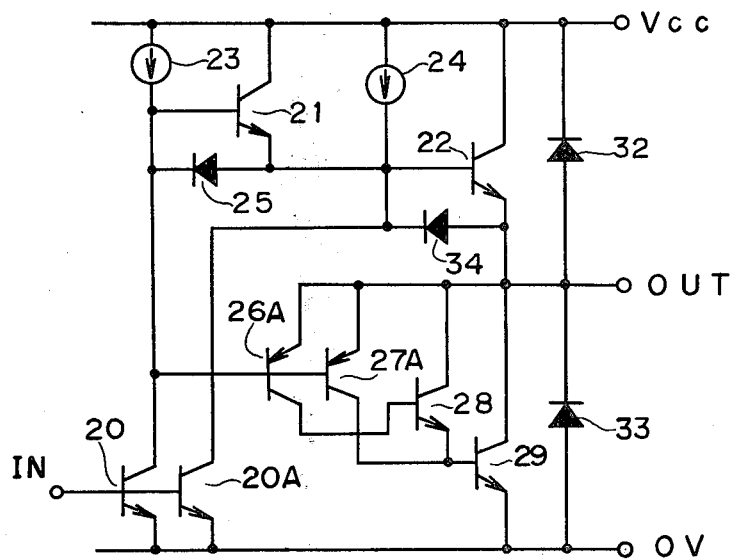

FIG. 4 shows an improved circuit for cancelling such residual voltage, wherein an additional driving transistor 20A controls the current from constant-current circuit 24 and the collector-emitter saturation voltage of the transistor 20A is counterbalanced by the base-emitter saturation voltage of transistor 22.

A diode 34 is a protecting diode for protecting the transistor 22 from its base-emitter breakdown when transistor 20A is turned on earlier than transistor 20. Such operation may occur when a capacitive load is connected. Transistors 22 and 29 never operate simultaneously even if transistors 20 and 20A operate at different timing.

As described above, according to the present invention a pair of output transistors are precluded from simultaneous operation. The consumption current of the output circuit is lowered by using Darlington circuits for a pair of complementary output transistors, respectively. Generally, the use of Darlington circuit for lowering the consumption current is disadvantageous in that the residual saturation voltage increases as a result. This disadvantage can be eliminated, when the load current is small, by biasing the transistors separately. That is, only the last stage transistor is operated by a biasing current. Darlington circuits each consisting of the three or more transistors may also be employed.

What is claimed is:

1. A proximity switching device, comprising:
   an oscillating circuit including a detection coil,
   a signal producing circuit for producing a detection signal in response to a change in the oscillation amplitude level of said oscillating circuit, and
   an output for producing an output signal in response to said detection,
   said output circuit comprising a pair of Darlington circuits and a driving transistor for driving said Darlington circuits,
   wherein one of said Darlington circuits operates as a NPN transistor and the other operates as a PNP transistor, said Darlington circuits being connected complementary to provide complementary output signals, and
   wherein one of said Darlington circuits is provided with a constant-current circuit which provides a constant base-biasing current to at least one of the transistors of the particular Darlington circuits.

2. A proximity switching device in accordance with claim 1, wherein each of said Darlington circuits comprises a plurality of transistors connected so that the number of transistors which are operating varies according to the magnitude of load current.

3. A proximity switching device in accordance with claim 1, wherein a unidirectional gate element is interposed across the base and emitter of the transistor to which said constant base-biasing current is provided.

4. A proximity switching device in accordance with claim 1, wherein said output circuit is integrated in a semiconductor chip.

* * * * *